(12) United States Patent
Iizuka et al.

(10) Patent No.: US 8,569,148 B2
(45) Date of Patent: Oct. 29, 2013

(54) FINAL POLISHING METHOD FOR SILICON SINGLE CRYSTAL WAFER AND SILICON SINGLE CRYSTAL WAFER

(75) Inventors: Naoto Iizuka, Chiyoda (JP); Hirotaka Kurimoto, Jyoetsu (JP); Koichi Kosaka, Chikuma (JP); Fumiaki Maruyama, Takasaki (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 640 days.

(21) Appl. No.: 12/449,017

(22) PCT Filed: Jan. 29, 2008

(86) PCT No.: PCT/JP2008/000101
§ 371 (c)(1),
(2), (4) Date: Jul. 21, 2009

(87) PCT Pub. No.: WO2008/102521
PCT Pub. Date: Aug. 28, 2008

(65) Prior Publication Data
US 2010/0090314 A1    Apr. 15, 2010

(30) Foreign Application Priority Data
Feb. 20, 2007  (JP) ................................. 2007-038937

(51) Int. Cl.
*H01L 21/306* (2006.01)
(52) U.S. Cl.
USPC 438/459; 438/692; 257/E21.23; 257/E21.237
(58) Field of Classification Search
USPC .............. 257/E21.23, E21.237; 438/459, 692
See application file for complete search history.

(56) References Cited

U.S. PATENT DOCUMENTS

| 6,530,826 B2 * | 3/2003 | Wenski et al. .................. 451/41 |
| 2005/0176250 A1 | 8/2005 | Takahashi et al. |
| 2006/0246724 A1 | 11/2006 | Takamatsu |

FOREIGN PATENT DOCUMENTS

| JP | A-02-114526 | 4/1990 |
| JP | A-2004-193529 | 7/2004 |
| JP | A-2005-045102 | 2/2005 |

OTHER PUBLICATIONS

Australian Search Report and Written Opinion issued in Singaporean Patent Application No. 200905260-6 on Oct. 27, 2009.
Japanese Office Action in Japanese Patent Application No. 2007-038937; dated Oct. 19, 2010 (with partial English-language translation).
Mar. 11, 2013 Taiwanese Office Action issued in Taiwanese Application No. 097104274 with partial English-language translation.

* cited by examiner

*Primary Examiner* — Colleen Matthews
(74) *Attorney, Agent, or Firm* — Oliff & Berridge, PLC

(57) ABSTRACT

The present invention provides a final polishing method for a silicon single crystal wafer that performs final polishing with a polishing rate being set to 10 nm/min or below at a final polishing step as a final step among a plurality of polishing steps for polishing the silicon single crystal wafer with a polishing slurry being interposed between the silicon single crystal wafer and a polishing pad, and a silicon single crystal wafer subjected to final polishing by this method. Hereby, there can be provided the final polishing method that can obtain a silicon single crystal wafer with less PIDs (Polishing Induced Defects) and the silicon single crystal wafer subjected to final polishing by this method.

9 Claims, 5 Drawing Sheets

(a)

(b)

(c)

FINAL POLISHING METHOD FOR SILICON SINGLE CRYSTAL WAFER AND SILICON SINGLE CRYSTAL WAFER

TECHNICAL FIELD

The present invention relates to a method for final polishing as a final step among a plurality of polishing steps for polishing a silicon single crystal wafer and to a silicon single crystal wafer that is polished.

BACKGROUND ART

In a conventional technology, a method for manufacturing a silicon single crystal wafer that is used as a semiconductor substrate material utilized in, e.g., various semiconductor devices generally includes a single-crystal growing process for manufacturing a single-crystal ingot by, e.g., a Czochralski (CZ) method or a floating zone (FZ) method and a wafer manufacturing (processing) process for slicing this single-crystal ingot and mirror-processing at least one main surface. A device is fabricated on the thus manufactured mirror-polished wafer.

Giving a further detailed explanation on the wafer manufacturing (processing) process, this process has a slicing step for slicing a single-crystal ingot to obtain thin discoid wafers, a chamfering step for chamfering an outer peripheral portion of each wafer to avoid cracks or chips of each wafer obtained at the slicing step, a lapping step for flattening this wafer, an etching step for removing a mechanical damage remaining in the chamfered and lapped wafer, a polishing step for finishing a wafer surface as a mirror surface, a cleaning step for cleaning the polished wafer to remove a polishing agent or a foreign matter that has adhered this wafer, and others. The main steps of the wafer processing process are described above, and steps such as a surface grinding step or a heat treatment step may be added, a certain step may be carried out on a plurality of stages, or the order of the steps may be changed.

In particular, the polishing step is divided into a primary polishing step that is called rough polishing and a final polishing step that is called precise polishing. Moreover, in some cases, the primary polishing step is further divided into two or more steps, and these steps are called, e.g., primary and secondary polishing steps. At each polishing step, a composition of a polishing slurry, a polishing pressure, and others are changed to provide conditions suitable for each step.

At the polishing step, for example, a polishing pad attached to an upper side of a rotatable turn table and an etched silicon single crystal wafer or the like supported on a wafer support plate of a polishing head are brought into contact with each other for polishing by using an appropriate pressure. At this time, an alkaline solution (which is called a polishing slurry or a polishing agent) containing a colloidal silica is used. When such a polishing agent is added to a contact surface of the polishing pad and the silicon single crystal wafer, the polishing slurry and the silicon single crystal wafer cause a mechanochemical effect, thereby advancing polishing.

Meanwhile, with advancement of miniaturization of a device rule, a size of a defect that can be a problem in device fabrication has been reduced. Further, small protrusive defects that are not acknowledged as a problem in the conventional technology have attracted attention. Furthermore, such defects are micro defects that are hardly detected by a conventional detector, but such micro defects can be observed by using, e.g., a confocal optical system laser microscope disclosed in Japanese Unexamined Patent Publication (Kokai) No. 2004-193529. As micro detects, a single protrusion, a plurality of protrusions, a linear protrusion, a micro LPD (Light Point Defect) and others are confirmed.

There are also many such micro defects that are introduced at the polishing step. The defects introduced at the polishing step are generically referred to as PIDs (Polishing Induced Defects).

Furthermore, as explained above, generation of the micro PIDs that do not become a problem in the conventional technology have been needed to be prevented.

To suppress generation of the PID, for example, Japanese Unexamined Patent Publication (Kokai) No. 2005-45102 suggests using a predetermined polishing slurry. However, even if such a method is adopted, suppression of the PIDs is insufficient.

DISCLOSURE OF THE INVENTION

In view of the above-explained problem, it is a main object of the present invention to provide a final polishing method that can obtain a silicon single crystal wafer having less PIDs.

To achieve this object, the present invention provides a final polishing method for a silicon single crystal wafer, wherein a polishing rate is set to 10 nm/min or below to perform final polishing at a final polishing step as a final step among a plurality of polishing steps for polishing the silicon single crystal wafer with a polishing slurry being interposed between the silicon single crystal wafer and a polishing pad.

If such a final polishing method for a silicon single crystal wafer that sets the polishing rate to 10 nm/min or below to perform final polishing at the final polishing step is used, generation of PIDs during the final polishing step can be suppressed. Moreover, when the polishing rate is set to a low rate, i.e., 5 nm/min or below, this setting is more preferable. As a result, a silicon single crystal wafer having less PIDs can be provided.

In this case, it is preferable to adjust the polishing rate in the final polishing by adjusting a relative velocity of the silicon single crystal wafer to be polished and the polishing pad.

When the polishing rate in final polishing is adjusted by adjusting the relative velocity of the silicon single crystal wafer to be polished and the polishing pad in this manner, the polishing rate can be adjusted by the simple adjustment method, and a sufficient effect can be obtained.

Additionally, it is preferable to set a polishing stock removal in the final polishing to 5 nm or above.

When such a polishing stock removal in the final polishing is set to 5 nm or above, haze on a silicon single crystal wafer surface can be more assuredly reduced.

Further, it is preferable to set a polishing rate at least at the end of the final polishing step to 10 nm/min or below.

When the polishing rate at least at the end of the final polishing step is set to 10 nm/min or below, a PID reducing effect is sufficient. Furthermore, when the polishing rate is first set to exceed 10 nm/min at the final polishing step and then the polishing rate is set to 10 nm/min or below, final polishing can be performed without considerably reducing productivity.

Moreover, the present invention provides a silicon single crystal wafer subjected to final polishing by the final polishing method for a silicon single crystal wafer, wherein the number of PIDs on a wafer surface is less than 100 in terms of a wafer having a diameter of 300 mm.

When the silicon single crystal wafer subjected to final polishing by the final polishing method for a silicon single crystal wafer is provided, it can be the silicon single crystal wafer in which the number of PIDs on a wafer surface is less than 100 in terms of a wafer having a diameter of 300 mm, thereby providing the unconventional high-quality silicon single crystal wafer having less PIDs.

According to the final polishing method for a silicon single crystal wafer of the present invention, generation of PIDs during the final polishing step can be suppressed, thus providing the silicon single crystal wafer having less PIDs. Moreover, when such a silicon single crystal wafer is put to a device process, a device can be fabricated with an excellent yield ratio.

BEST MODES FOR CARRYING OUT THE INVENTION

The present invention will now be explained hereinafter in more detail, but the present invention is not restricted thereto.

As explained above, suppressing generation of micro PIDs which do not become a problem in the conventional technology is demanded.

It has been conventionally considered that PIDs are mainly introduced in primary polishing and secondary polishing and there is almost no influence of final polishing with a very small polishing stock removal. However, it has been revealed from an examination conducted by the present inventors that final polishing affects generation of PIDs in no small measure.

Figure 5:
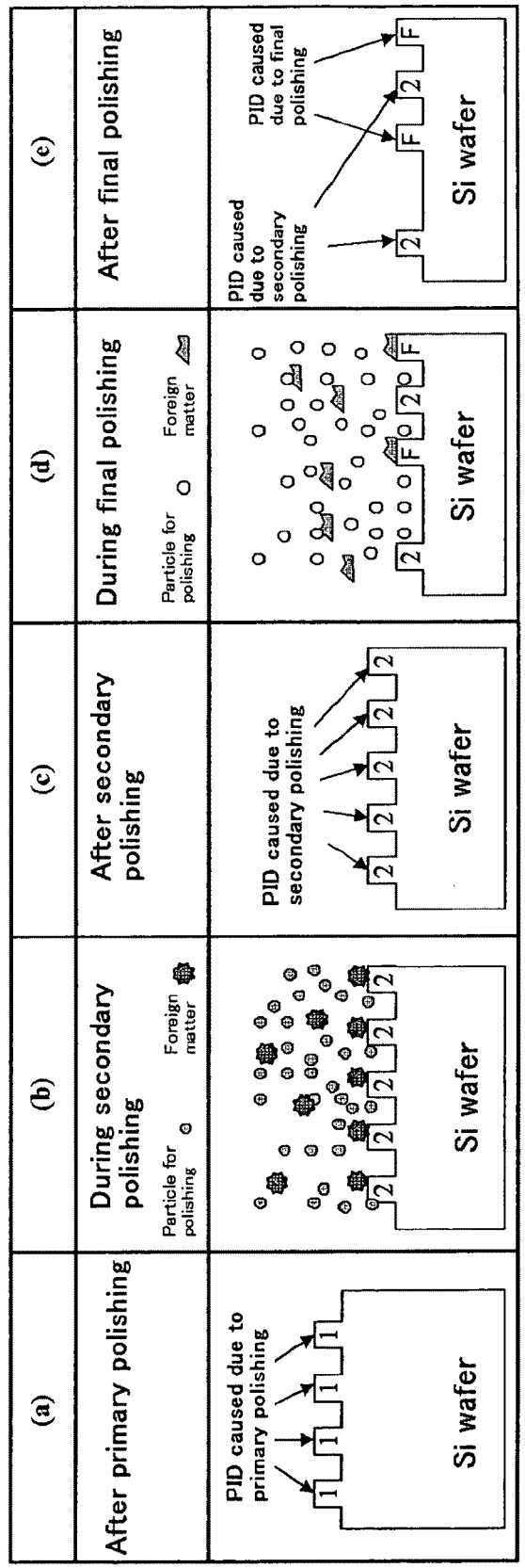
FIG. 5 is an explanatory drawing of a hypothesis of a fundamental principle of generation of PIDs during the polishing step.

A hypothesis originated by the present inventors as one of fundamental principles of generation of a linear protrusion as a typical PID will now be explained in relation to a situation where a polishing process has three steps, i.e., primary polishing, secondary polishing, and final polishing with reference to FIG. 5.

Figure 7:
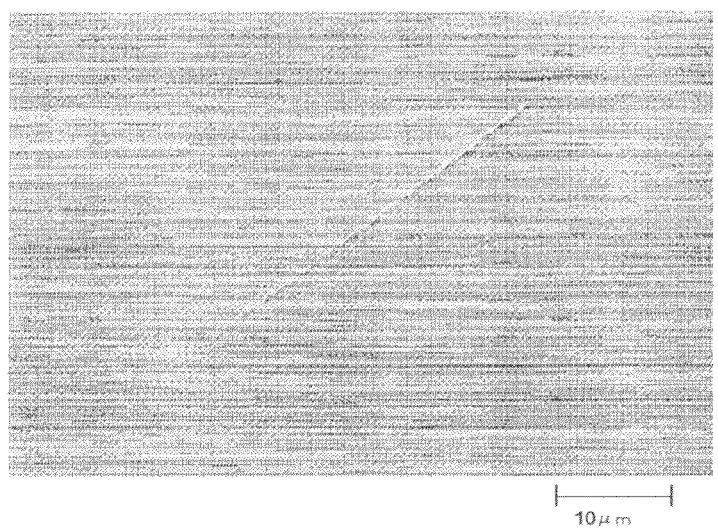
FIG. 7 are images obtained by imaging a linear protrusion by a confocal optical system laser microscope and an atom force microscope.
Figure 7:
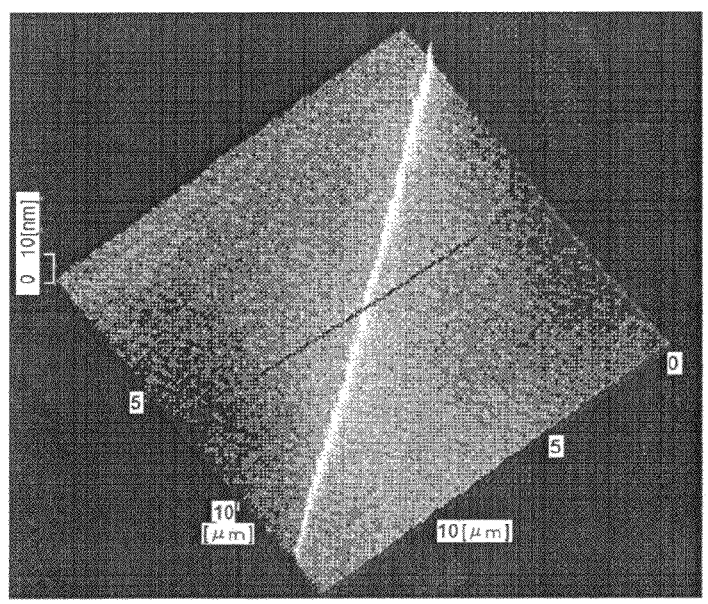
Figure 7:
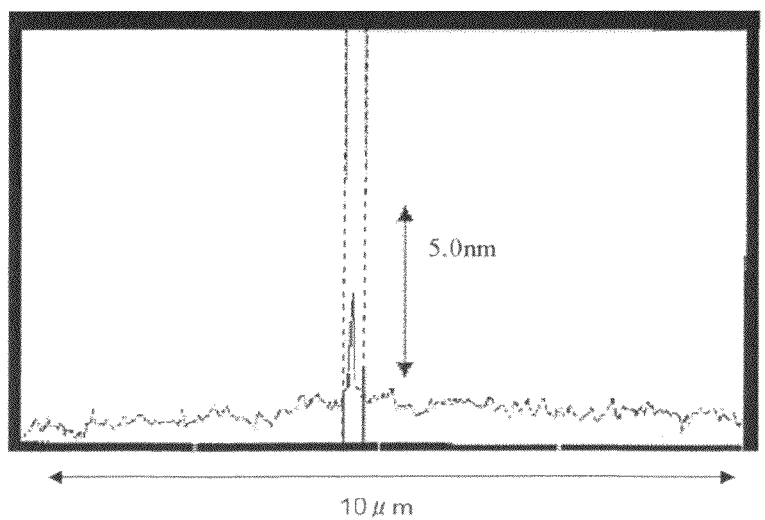

Although the linear defect is a micro PID that is hardly detected by a conventional examination device, but it is readily observed by using, e.g., a confocal optical system laser microscope to observe a surface of a silicon single crystal wafer (FIG. 7(a)). As characteristics, as shown in FIGS. 7(b) and (c), in observation of the linear defect by using an atomic force microscope (AFM), the linear defect is a linear protruding defect having a height of 5 nm or below, a width of 100 to 300 nm, and a length of approximately 0.5 μm or above.

A hypothesis of a fundamental principle of generation of a PID during the polishing step will now be explained with reference to the drawings.

FIG. 5(a) shows a silicon single crystal wafer after terminating primary polishing and before starting secondary polishing. A PID is produced even after primary polishing. However, the PID produced due to primary polishing does not become a problem because a polishing stock removal in secondary polishing is large.

FIG. 5(b) shows a state during secondary polishing.

Foreign matters are mixed in a polishing slurry separately from polishing particles (e.g., a colloidal silica). As such foreign matters, for example, contamination of a polishing slurry piping system, a gelled substance of a colloidal silica, a particle other than a silica in a polishing slurry raw material, a foreign matter of a fiber torn from the polishing pad, and others can be considered. These foreign matters are present to a greater or lesser extent, and generally do not have a polishing capability. Therefore, polishing of a portion to which these foreign matters have adhered is delayed, resulting in a micro protruding defect (FIG. 5(c)).

FIG. 5(d) shows a state during final polishing.

Although the linear protrusion produced in secondary polishing is partially removed in final polishing but it partially remains. Further, the same mechanism as that in the secondary polishing also causes generation of a linear protrusion owing to final polishing during final polishing.

It has been considered that a PID due to secondary polishing and a PID due to final polishing are generated on polished surface of the silicon single crystal wafer after end of final polishing in this manner as shown in FIG. 5(e).

Based on such a hypothesis, the present inventors have considered that reducing a polishing rate at the polishing step to slowly perform polishing enables removing a foreign matter that has adhered to the surface of the silicon single crystal wafer before a protrusion is formed.

A purpose of performing final polishing with respect to the silicon single crystal wafer is to flatten the wafer surface until haze is eliminated and to cleanly finish this surface. Further, a polishing material, polishing conditions, a polishing stock removal, and others are managed to achieve this purpose. However, the polishing rate at the final polishing step is consistently a consequence determined under the set polishing conditions, and specification or management of a range is not performed in particular. That is, in the conventional technology, a polishing stock removal in final polishing is usually as very small as approximately 10 to 80 nm or below, a polishing rate does not have to be managed, and polishing is just performed until a degree of haze meets a standard. Furthermore, the polishing rate is increased as high as possible for convenience of production.

However, based on the above-explained knowledge found by the present inventors, the present inventors have conceived that managing and controlling a polishing rate even at the final polishing step enables suppressing a PID, especially a linear protrusion that is generated at the final polishing step, and a total amount of PIDs produced at the entire polishing step can be thereby suppressed, thus bringing the present invention to completion.

An embodiment according to the present invention will now be specifically explained hereinafter.

Although an example where a polishing process has three steps, i.e., primary polishing, secondary polishing, and final polishing will be explained hereinafter, but the present invention is not restricted thereto, and it can be applied to a silicon single crystal wafer manufacturing process having a plurality of polishing steps.

First, a silicon single crystal wafer is prepared, and various kinds of processing before a polishing step are carried out. It is to be noted that the silicon single crystal wafer includes a wafer that is entirely formed of a silicon single crystal as well as a wafer in which at least a polishing target surface is formed of a silicon single crystal in this specification. For example, the present invention can be applied to final polishing for, e.g., an SOI (Silicon on Insulator) wafer in which a single-crystal silicon layer is formed on an insulator.

Then, primary polishing and secondary polishing are performed with respect to this silicon single crystal wafer by using a regular method. A polishing method in this example is not restricted in particular. As a polishing machine, either a double-side polishing machine or a single-side polishing machine can be used. Moreover, various conditions, e.g., a composition of a polishing slurry, a temperature, a polishing pressure, a polishing stock removal, a polishing rate, and others are not restricted in particular.

Final polishing as a final step in the polishing steps is carried out at a polishing rate (a polishing stock removal per minute) set to 10 nm/min or below with respect to the silicon single crystal wafer subjected to primary polishing and secondary polishing. It is to be noted that this does not necessarily mean constantly setting the polishing rate to 10 nm/min or below during the final polishing step alone but includes a conformation where the polishing rate is set to 10 nm/min or below in at least a part of the final polishing step to perform polishing. In particular, it is preferable to first set the polishing rate to a high rate exceeding 10 nm/min at the final polishing step, then set the polishing rate to 10 nm/min or below, and set the polishing rate to 10 nm/min or below at least at the end of the final polishing step.

It is to be noted that a reason for setting the polishing rate to 10 nm/min or below will be explained later.

The present invention can be applied to either a double-side polishing machine or a single-side polishing machine as a polishing machine in final polishing.

Figure 6:
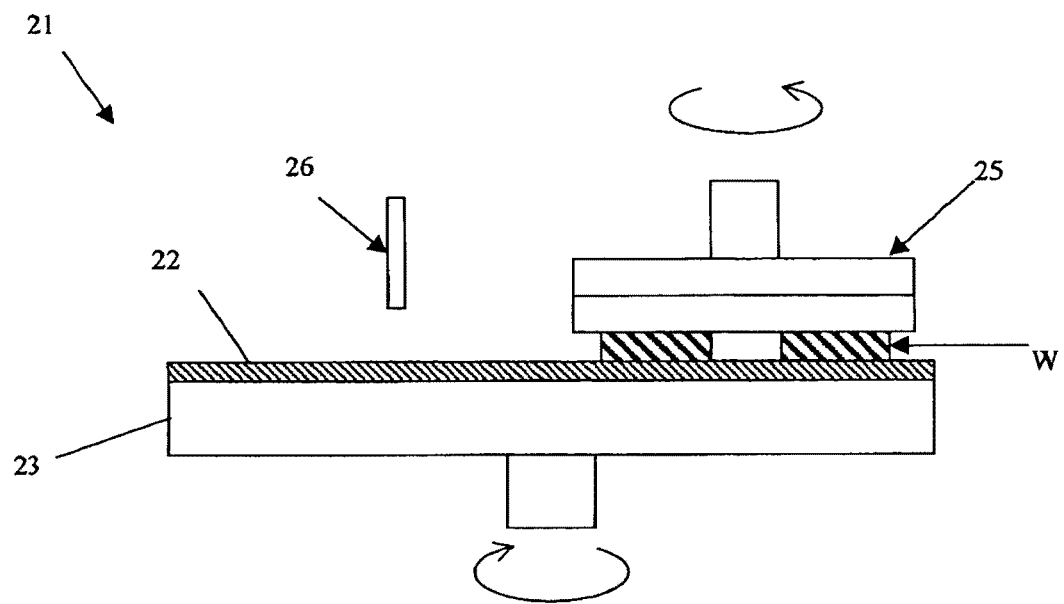
FIG. 6 is a schematic cross-sectional view showing an example of a single-side polishing apparatus.

FIG. 6 shows a schematic cross-sectional view of an example of the single-side polishing machine.

This single-side polishing machine 21 includes a turn table 23 having a polishing pad 22 attached thereto, a polishing head 25 that holds a silicon single crystal wafer W, polishing slurry supplying means 26, and others. The turn table 23 and the polishing head 25 are rotated by a non-depicted driving source, a wafer W is in sliding contact with the polishing pad 22, and a polishing target surface of the silicon single crystal wafer W is polished. At the time of polishing, a polishing slurry is supplied from the polishing slurry supplying means 26.

Although various means can be adopted to adjust a polishing rate, adjusting a relative velocity of the silicon single crystal wafer to be polished and the polishing pad enables adjusting the polishing rate by a simple adjustment method, and a sufficient effect can be obtained. Adjustment of the relative velocity of the silicon single crystal wafer and the polishing pad can be performed by adjusting a rotating rate of the turn table 23 and a rotating rate of the polishing head 25 if, e.g., the single-side polishing machine depicted in FIG. 6 is used.

Besides, the polishing rate can be adjusted by adjusting a composition or pH of the polishing slurry, a type or an operating time of the polishing pad, a temperature at the time of polishing, a polishing pressure, and others, and these conditions can be appropriately selected.

The specific various conditions required to set the polishing rate to a predetermined value can be experimentally obtained by, e.g., actually polishing the silicon single crystal wafer and calculating the polishing rate from measurement of a polishing stock removal.

As explained above, generation of a PID in final polishing can be suppressed by setting the polishing rate to 10 nm/min or below at the final polishing step. Additionally, it is further preferable to set the polishing rate to a low rate, i.e., 5 nm or below. Further, in particular, the polishing rate is first set to exceed 10 nm/min at the final polishing step to efficiently reduce haze, then the polishing rate is set to 10 nm/min or below, and the polishing rate is set to 10 nm/min or below at least at the end of the final polishing step, thereby sufficiently reducing PIDs. When such a setting is configured, final polishing can be performed without significantly reducing productivity, and both haze and PIDs can be decreased, which is preferable. A polishing stock removal in polishing when the polishing rate is set to 10 nm/min or below in this example can be set to, e.g., 1 nm or above, and an effect of sufficiently reducing PIDs can be obtained.

It is to be noted that setting a polishing stock removal in final polishing to 5 nm or above for the purpose of reducing haze is preferable.

A reason for setting the polishing rate to 10 nm or below and others will now be described in regard to experimental examples where a polishing process has three steps, i.e., primary polishing, secondary polishing, and final polishing.

EXPERIMENTAL EXAMPLE 1

Two silicon single crystal wafers subjected to various kinds of processing until just before primary polishing were prepared. Each prepared silicon single crystal wafer is a P-type (resistivity: 1 Ωcm or above) CZ silicon single crystal wafer having a diameter of 200 mm.

Then, primary polishing was performed by using a double-side polishing machine, a polishing pad of urethane foam, and a polishing slurry of an NaOH-based colloidal silica with a total polishing stock removal on both sides being set to approximately 20 μm.

Subsequently, secondary polishing was performed by using a single-side polishing machine, a polishing pad of a polyurethane nonwoven fabric, and a polishing slurry of an NaOH-base colloidal silica with a polishing stock removal being set to approximately 0.5 to 1.5 μm.

Then, final polishing was performed by using such a single-side polishing machine as shown in FIG. 6, a polishing pad of polyurethane suede utilized for approximately 1000 minutes, and a polishing slurry of an $NH_4OH$-based colloidal silica with a polishing time being set to 2.5 minutes. In this case, a rotating rate of a turn table was set to 25 rpm (Sample 1) and 40 rpm (Sample 2). Each polishing stock removal in final polishing was measured after polishing, the polishing stock removals were 8.30 nm (Sample 1) and 20.6 nm (Sample 2), and polishing rates were 3.32 nm/min (Sample 1) and 8.24 nm/min (Sample 2), respectively.

Measurement of PIDs on a surface of each polished silicon single crystal wafer was carried out by using a confocal optical system laser microscope (MAGICS manufactured by Lasertec Corporation). As measurement conditions of MAGICS, Normal Scan and Slice Level 24 mV were adopted, and a measurement value of a wafer having a diameter of 200 mm was converted into the number per an area having a diameter of 300 mm. Judging whether a measured defect is a PID actually introduced during the polishing step is difficult, but a defect that can be measured by using the confocal optical system laser microscope is regarded as a PID in this specification.

The numbers of PIDs were 31 (Sample 1) and 47 (Sample 2), respectively. It is to be noted that approximately ⅓ of the PIDs were linear protrusions, approximately ⅔ of the PIDs were micro LPDs, and the number of other defect types is small in each sample.

EXPERIMENTAL EXAMPLE 2

Like Experimental Example 1, two silicon single crystal wafers subjected to various kinds of processing until just before primary polishing were prepared. Each prepared silicon single crystal wafer is a P-type (resistivity: 1 Ωcm or above) CZ silicon single crystal wafer having a diameter of 200 mm. In this case, a polishing pad utilized for approximately 5000 minutes was used, and a rotating rate of a turn table was set to 25 rpm (Sample 3) and 40 rpm (Sample 4) to perform final polishing with respect to the silicon single crystal wafers. At this time, polishing stock removals were 22.4 nm (Sample 3) and 36.4 nm (Sample 4), and polishing rates were 8.96 nm/min (Sample 3) and 14.6 nm/min (Sample 4), respectively.

The numbers of PIDs were measured like Experimental Example 1, they were 61 (Sample 3) and 110 (Sample 4), approximately ⅓ of the PIDs were linear protrusions, approximately ⅔ of the PIDs were micro LPDs, and the number of other defect types was small.

Figure 1:
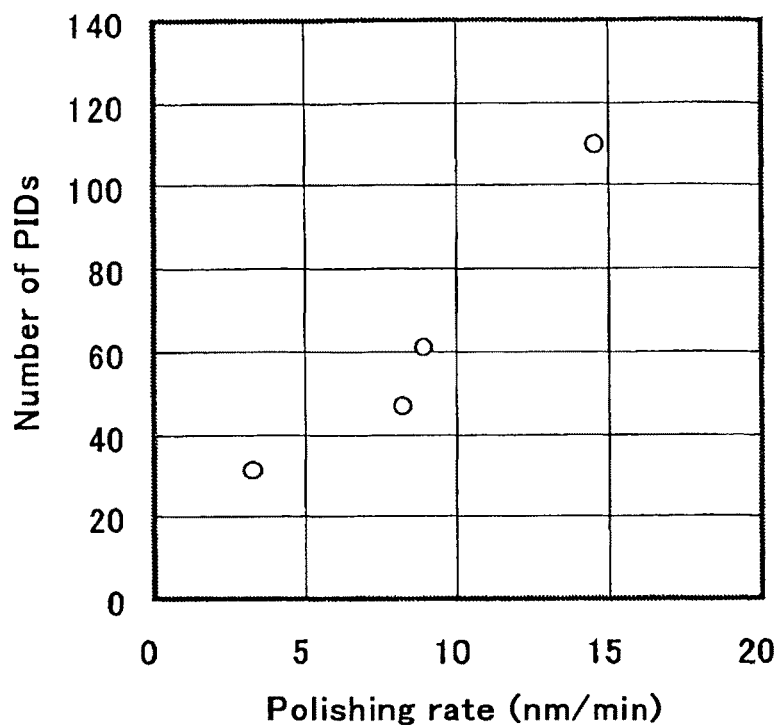
FIG. 1 is a graph showing a relationship between a polishing rate and the number of PIDs on a wafer surface at a final polishing step in Experimental Examples 1 and 2.

FIG. 1 shows a relationship between the polishing rate and the number of PIDs at the final polishing step obtained from Experimental Examples 1 and 2.

It can be understood from FIG. 1 that the polishing rate and the number of PIDs have a positive correlation.

Further, since the polishing pads having different used hours (pad lives) were used in Experimental Example 1 and Experimental Example 2, the polishing rates are different even though the rotating rate of the turn table is the same, but paying attention to the relationship between the polishing rate and the number of PIDs enables confirming presence of the correlation.

EXPERIMENTAL EXAMPLE 3

First, six silicon single crystal wafers subjected to various kinds of processing until just before primary polishing were prepared. Each prepared silicon single crystal wafer is a P-type (resistivity: 1 Ω·cm or above) CZ silicon single crystal wafer having a diameter of 200 mm.

Then, primary polishing was performed by using a single-side polishing machine, a polishing pad of a polyurethane nonwoven fabric, and a polishing slurry of an NaOH-based colloidal silica with a polishing stock removal being set to approximately 8 to 12 μm.

Subsequently, secondary polishing was performed by using a single-side polishing machine, a polishing pad of a polyurethane nonwoven fabric, and a polishing slurry of an NaOH-based colloidal silica with a polishing stock removal being set to approximately 0.5 to 1.5 μm.

Then, final polishing was performed by using such a single-side polishing machine as shown in FIG. 6, a polishing pad of polyurethane suede, and a polishing slurry of an $NH_4OH$-based colloidal silica. In this case, polishing was performed with a rotating rate of a polishing head being set to a fixed value and a rotating rate of a turn table and a polishing time being set as shown in the following Table 1.

As a result of measuring polishing stock removals in final polishing after polishing, such polishing stock removals and polishing rates as shown in Table 1 were obtained.

TABLE 1

| Sample number | Wafer diameter (mm) | Rotating rate of turn table | Polishing time | Polishing stock removal (nm) | Polishing rate (nm/min) |
|---|---|---|---|---|---|
| 5 | 200 | 10 rpm | 6 minutes | 64.1 | 10.7 |
| 6 | 200 | 10 rpm | 12 minutes | 119.4 | 10.0 |
| 7 | 200 | 5 rpm | 6 minutes | 43.5 | 7.26 |
| 8 | 200 | 5 rpm | 12 minutes | 72.1 | 6.01 |
| 9 | 200 | 2 rpm | 12 minutes | 39.1 | 3.26 |
| 10 | 200 | 2 rpm | 30 minutes | 75.3 | 2.51 |

Figure 2:
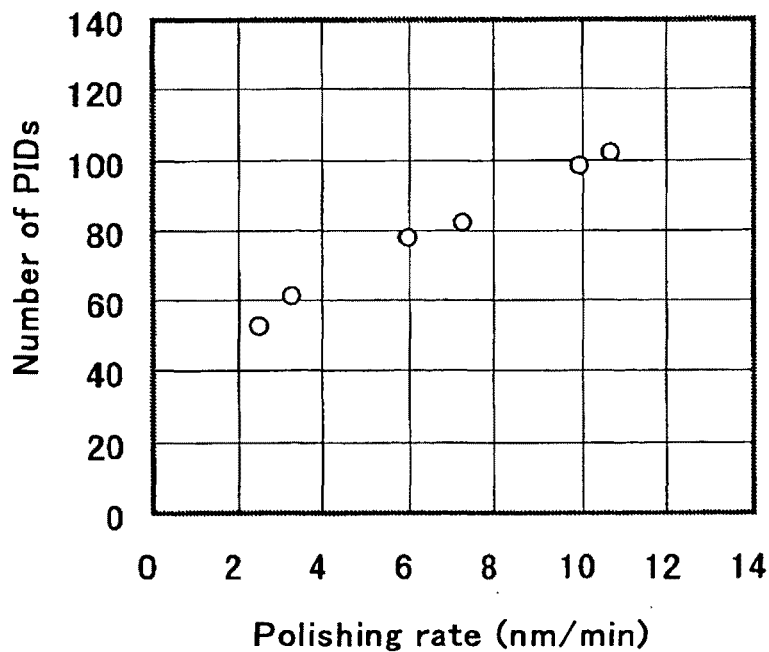
FIG. 2 is a graph showing a relationship between a polishing rate and the number of PIDs on a wafer surface at a final polishing step in Experimental Example 3.

The numbers of PIDs in Samples 5 to 10 were measured like Experimental Example 1, and FIG. 2 shows a relationship between the polishing rate and the number of PIDs at the final polishing step.

It can be understood from FIG. 2 that the polishing rate and the number of PIDs have a positive correlation.

Figure 4:
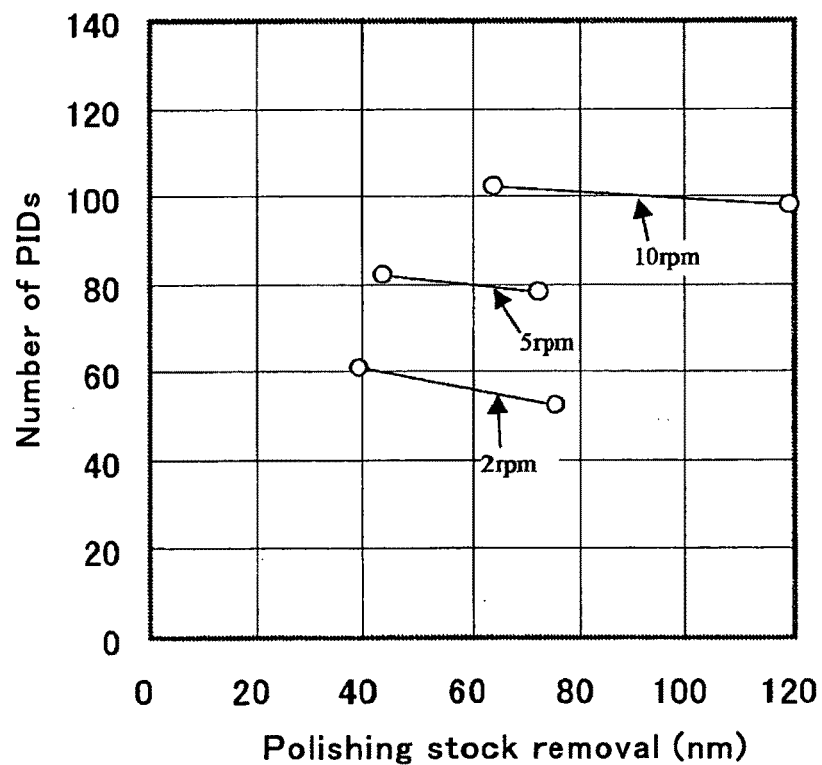
FIG. 4 is a graph showing a relationship between a polishing stock removal and the number of PIDs on a wafer surface at the final polishing step in Experimental Example 3.

Additionally, FIG. 4 shows a relationship between the polishing stock removal and the number of PIDs in Experimental Example 3. As shown in FIG. 4, the samples subjected to polishing at substantially the same polishing rate and having different polishing stock removals (i.e., the samples polished at the same rotating rate of the turn table for different polishing times) do not have a correlation. That is, it can be understood that the polishing stock removal itself and the number of PIDs do not directly have a correlation.

EXPERIMENTAL EXAMPLE 4

Four P-type (resistivity: 10 cm or above) CZ silicon single crystal wafers were prepared like Experimental Example 1, but each wafer has a diameter of 300 mm, and final polishing was performed with a rotating rate of a turn table being set to 43, 30, 20, and 10 rpm (Samples 11 to 14). At this time, polishing stock removals were 44.6, 29.4, 18.2, and 6.17 nm, and polishing rates were 19.1, 12.6, 7.83, and 2.65 nm/min, respectively.

Figure 3:
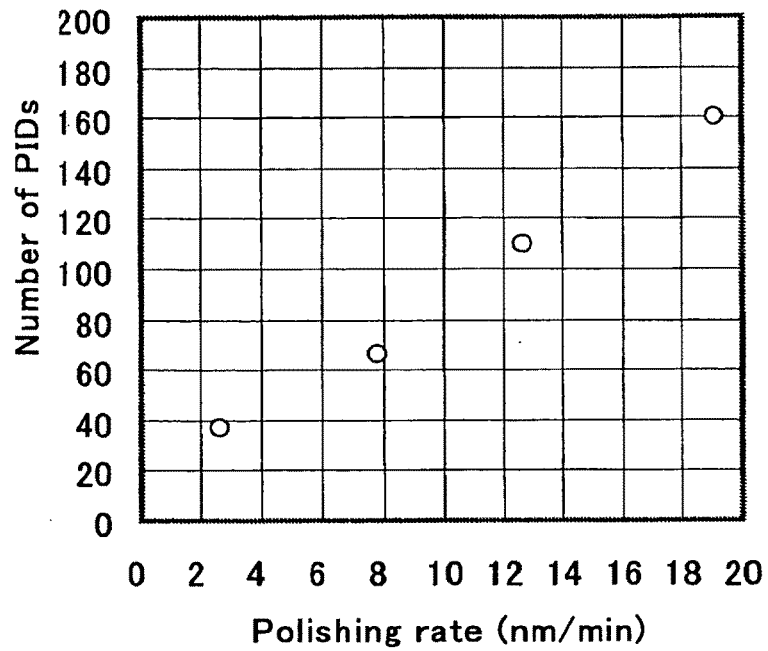
FIG. 3 is a graph showing a relationship between a polishing rate and the number of PIDs on a wafer surface at a final polishing step in Experimental Example 4.

The numbers of PIDs in Samples 11 to 14 were measured like Experimental Example 1, and FIG. 3 shows a relationship between the polishing rate and the number of PIDs at the final polishing step.

It can be likewise understood from FIG. 3 that the polishing rate and the number of PIDs have a positive correlation.

Table 2 shows a summary of polishing conditions and the number of PIDs in final polishing of each of Experimental Examples 1 to 4.

TABLE 2

| Experimental example number | Sample number | Wafer diameter (mm) | Polishing rate (nm/min) | Number of PIDs (Note) in terms of wafer having diameter 300 mm |
|---|---|---|---|---|
| 1 | 1 | 200 | 3.32 | 31 |
|   | 2 |     | 8.24 | 47 |
| 2 | 3 | 200 | 8.96 | 61 |
|   | 4 |     | 14.6 | 110 |
| 3 | 5 | 200 | 10.7 | 102 |
|   | 6 |     | 10.0 | 98 |
|   | 7 |     | 7.26 | 82 |
|   | 8 |     | 6.01 | 78 |
|   | 9 |     | 3.26 | 61 |
|   | 10 |    | 2.51 | 53 |
| 4 | 11 | 300 | 19.1 | 160 |
|   | 12 |     | 12.6 | 110 |
|   | 13 |     | 7.83 | 66 |
|   | 14 |     | 2.65 | 36 |

It can be understood from the above-explained experimental results that setting the polishing rate at the final polishing step to 10 nm/min or below enables effectively suppressing generation of PIDs and providing the polished wafer with the very small number of PIDs, e.g., less than 100 in terms of a wafer having a diameter of 300 mm. Additionally, it was found that further reducing the polishing rate enables further suppressing the number of PIDs and setting the polishing rate to, e.g., 5 nm/min or below enables suppressing the number of PIDs to approximately 80 or below.

It is to be noted that a lower limit of the polishing rate at the final polishing step is not restricted in particular, but it is determined based on, e.g., achievement of productivity, an effect of reducing haze, or controllability and can be set to, e.g., 0.1 nm/min or above.

It is to be noted that the present invention is not restricted to the foregoing embodiments. The foregoing embodiment is just an example, and any examples which have substantially the same structures and demonstrate the same functions and effects as those in the technical concept described in claims of the present invention are included in the technical scope of the present invention.

The invention claimed is:

1. A final polishing method for a silicon single crystal wafer, wherein
   the method is performed before a device fabrication process, and
   at a final polishing step as a final step among a plurality of polishing steps for polishing the silicon single crystal wafer with a polishing slurry being interposed between the silicon single crystal wafer and a polishing pad, the method comprising:
   first setting a polishing rate to exceed 10 nm/min, and then setting the polishing rate at least at the end of the final polishing step to 5 nm/min or below.

2. The final polishing method for a silicon single crystal wafer according to claim 1, wherein the polishing rate in the final polishing is adjusted by adjusting a relative velocity of the silicon single crystal wafer to be polished and the polishing pad.

3. A silicon single crystal wafer subjected to final polishing by the final polishing method for a silicon single crystal wafer according to claim 2, wherein the number of PIDs on a wafer surface is less than 100 in terms of a wafer having a diameter of 300 mm.

4. The final polishing method for a silicon single crystal wafer according to claim 1, wherein a polishing stock removal in the final polishing is set to 5 nm or above.

5. A silicon single crystal wafer subjected to final polishing by the final polishing method for a silicon single crystal wafer according to claim 4, wherein the number of PIDs on a wafer surface is less than 100 in terms of a wafer having a diameter of 300 mm.

6. The final polishing method for a silicon single crystal wafer according to claim 2, wherein a polishing stock removal in the final polishing is set to 5 nm or above.

7. A silicon single crystal wafer subjected to final polishing by the final polishing method for a silicon single crystal wafer according to claim 6, wherein the number of PIDs on a wafer surface is less than 100 in terms of a wafer having a diameter of 300 mm.

8. A silicon single crystal wafer subjected to final polishing by the final polishing method for a silicon single crystal wafer according to claim 1, wherein the number of PIDs on a wafer surface is less than 100 in terms of a wafer having a diameter of 300 mm.

9. The final polishing method for a silicon single crystal wafer according to claim 1, wherein a stock removal of the polishing with a polishing rate of 5 nm/min or below is 1 nm or above.

* * * * *